United States Patent
Sun et al.

(10) Patent No.: US 12,385,986 B2
(45) Date of Patent: Aug. 12, 2025

(54) METHOD AND APPARATUS FOR MEASURING ELECTROMIGRATION OF SOLDER JOINT

(71) Applicant: SANECHIPS TECHNOLOGY CO., LTD, Guangdong (CN)

(72) Inventors: Niuyi Sun, Guangdong (CN); Dan Yang, Guangdong (CN); Na Mei, Guangdong (CN); Tuobei Sun, Guangdong (CN)

(73) Assignee: SANECHIPS TECHNOLOGY CO., LTD., Guangdong (CN)

( * ) Notice: Subject to any disclaimer, the term of this patent is extended or adjusted under 35 U.S.C. 154(b) by 197 days.

(21) Appl. No.: 18/265,358

(22) PCT Filed: Nov. 25, 2021

(86) PCT No.: PCT/CN2021/133197
§ 371 (c)(1),
(2) Date: Jun. 5, 2023

(87) PCT Pub. No.: WO2022/116891
PCT Pub. Date: Jun. 9, 2022

(65) Prior Publication Data
US 2024/0036123 A1   Feb. 1, 2024

(30) Foreign Application Priority Data
Dec. 4, 2020 (CN) .......................... 202011407646.3

(51) Int. Cl.
*G01R 31/71* (2020.01)
*G01R 27/14* (2006.01)

(52) U.S. Cl.
CPC ............. *G01R 31/71* (2020.01); *G01R 27/14* (2013.01)

(58) Field of Classification Search
CPC ...... G01R 31/71; G01R 27/14; G01R 31/2858; G01R 31/00; H01L 22/00
USPC .......................................... 324/537
See application file for complete search history.

(56) References Cited

U.S. PATENT DOCUMENTS

| | | | | |
|---|---|---|---|---|
| 5,477,160 A | * | 12/1995 | Love | G01R 1/07314 324/762.02 |
| 6,466,038 B1 | * | 10/2002 | Pekin | G01R 31/2896 324/717 |
| 8,921,127 B2 | * | 12/2014 | Frye | G01R 31/2858 257/738 |

(Continued)

FOREIGN PATENT DOCUMENTS

| CN | 102183548 A | 9/2011 |
|---|---|---|
| CN | 102749518 A | 10/2012 |

(Continued)

OTHER PUBLICATIONS

WIPO, International Search Report issued on Mar. 2, 2022.

*Primary Examiner* — Christopher P McAndrew
(74) *Attorney, Agent, or Firm* — Li & Cai Intellectual Property (USA) Office (57) ABSTRACT

Disclosed are a method and an apparatus for measuring electromigration of solder joints. The method includes: determining, according to voltage test pads led out from both ends of one or more solder joints, a voltage of a daisy subchain between the one or more solder joints (S502); and determining, according to the voltage, a resistance of the one or more solder joints (S504).

15 Claims, 5 Drawing Sheets

(56) References Cited

U.S. PATENT DOCUMENTS

| | | |
|---|---|---|
| 2004/0021232 A1 | 2/2004 | Pekin et al. |
| 2004/0100293 A1 | 5/2004 | Bottcher et al. |
| 2006/0194353 A1 | 8/2006 | Spuhler et al. |
| 2012/0268147 A1* | 10/2012 | Chen ..................... H01L 22/34 |
| | | 324/713 |
| 2013/0248859 A1 | 9/2013 | Frye et al. |
| 2017/0146592 A1* | 5/2017 | Freeman ............ G01R 31/2858 |
| 2017/0162454 A1* | 6/2017 | Rogers ............... G01R 31/2858 |

FOREIGN PATENT DOCUMENTS

| | | |
|---|---|---|
| CN | 105445328 A | 3/2016 |
| CN | 111725152 A | 9/2020 |

* cited by examiner

METHOD AND APPARATUS FOR MEASURING ELECTROMIGRATION OF SOLDER JOINT

CROSS-REFERENCE TO RELATED APPLICATIONS

The present disclosure is a National Phase Application filed under 35 U.S.C. 371 as a national stage of PCT/CN2021/133197, filed on Nov. 25, 2021, an application claiming the priority to Chinese Patent Application No. 202011407646.3 filed with the CNIPA on Dec. 4, 2020, the entire contents of which are incorporated herein by reference.

TECHNICAL FIELD

Embodiments of the present application relate to the technical field of semiconductor metal electromigration test, and specifically relate to a method and an apparatus for measuring electromigration of solder joints.

BACKGROUND

Solder joint electromigration lifetime is one of the important indexes for evaluating the package and board level reliability. There are many effective test structures available for accelerated lifetime tests of solder joint electromigration, and a daisy chain that connects solder joints in series is one of the commonly used test structures.

Figure 1:
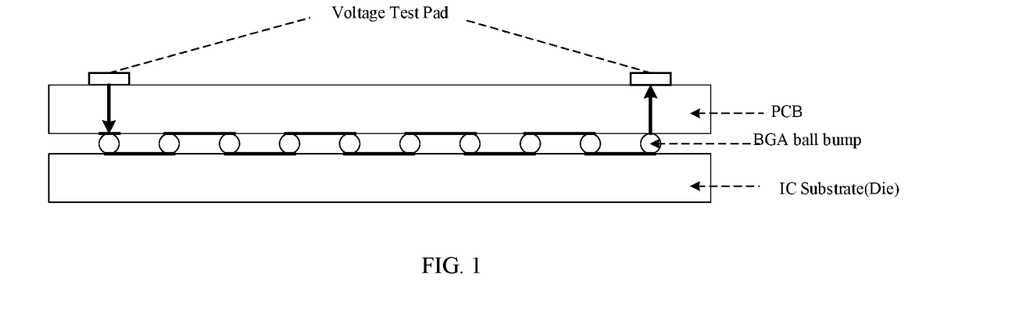
FIG. 1 is a schematic diagram of a daisy chain in the existing art.

FIG. 1 is a schematic diagram of a daisy chain in the existing art. As shown in FIG. 1, the package and board level daisy chain design of solder joints is a single chain which simply connects solder joints in series, and has the following defects: a traditional daisy chain has merely two ends, and in order to meet the requirement ($R_{min}$) on resistance measurement precision of the test system, a daisy chain of a certain length is desired; and a traditional daisy chain measures the resistance through two-terminal measurement, which can measure only a total resistance of the whole daisy chain rather than a resistance of a single solder joint.

For the problem that solder joint resistance measurement by means of two-terminal measurement cannot measure the resistance of a single solder joint in the existing art, no solution has been proposed yet.

SUMMARY

Embodiments of the present application provide a method and an apparatus for measuring electromigration of solder joints, so as to solve at least the problem that solder joint resistance measurement by means of two-terminal measurement cannot measure the resistance of a single solder joint in the existing art.

According to an embodiment of the present application, there is provided an apparatus for measuring electromigration of solder joints, including: a power source, a controller, and a voltage measurement structure, wherein the power source is respectively connected to the controller and the voltage measurement structure in parallel, the voltage measurement structure includes an upper substrate and a lower substrate, metal connecting wires on the upper substrate and the lower substrate are connected in series through a plurality of solder joints to form a daisy chain, and voltage test pads are led out from both ends of each of the plurality of solder joints and arranged outside the upper substrate and the lower substrate, respectively, the voltage measurement structure is configured to measure a voltage of a daisy subchain between one or more solder joints through the voltage test pads under control of the controller; and the controller is configured to determine, according to the voltage, a resistance of the one or more solder joints.

According to another embodiment of the present application, there is further provided a method for measuring electromigration of solder joints, including: determining, according to voltage test pads led out from both ends of one or more solder joints, a voltage of a daisy subchain between the one or more solder joints; and determining, according to the voltage, a resistance of the one or more solder joints.

According to still another embodiment of the present application, there is further provided an apparatus for measuring electromigration of solder joints, including: a first determination module configured to determine, according to voltage test pads led out from both ends of one or more solder joints, a voltage of a daisy subchain between the one or more solder joints; and a second determination module configured to determine, according to the voltage, a resistance of the one or more solder joints.

According to still another embodiment of the present application, there is further provided an electronic apparatus, including a memory and a processor, where the memory has a computer program stored thereon, and the processor is configured to execute the computer program to implement operations of any one of the method embodiments as described above.

In the embodiments of the present application, by determining, according to voltage test pads led out from both ends of one or more solder joints, the voltage of the daisy subchain between the one or more solder joints; and determining, according to the voltage, the resistance of the one or more solder joints, the problem that solder joint resistance measurement by means of two-terminal measurement cannot measure the resistance of a single solder joint in the existing art can be solved, the resistance of a single solder joint can be measured, and effective reliability evaluation of solder joint electromigration failure can be implemented.

DETAIL DESCRIPTION OF EMBODIMENTS

Embodiments of the present application will be described in detail below with reference to the drawings in conjunction with the embodiments.

It should be noted that terms "first", "second", and the like in the description, claims and drawings of the present application are used for the purpose of distinguishing similar objects instead of indicating a specific order or sequence.

Figure 2:
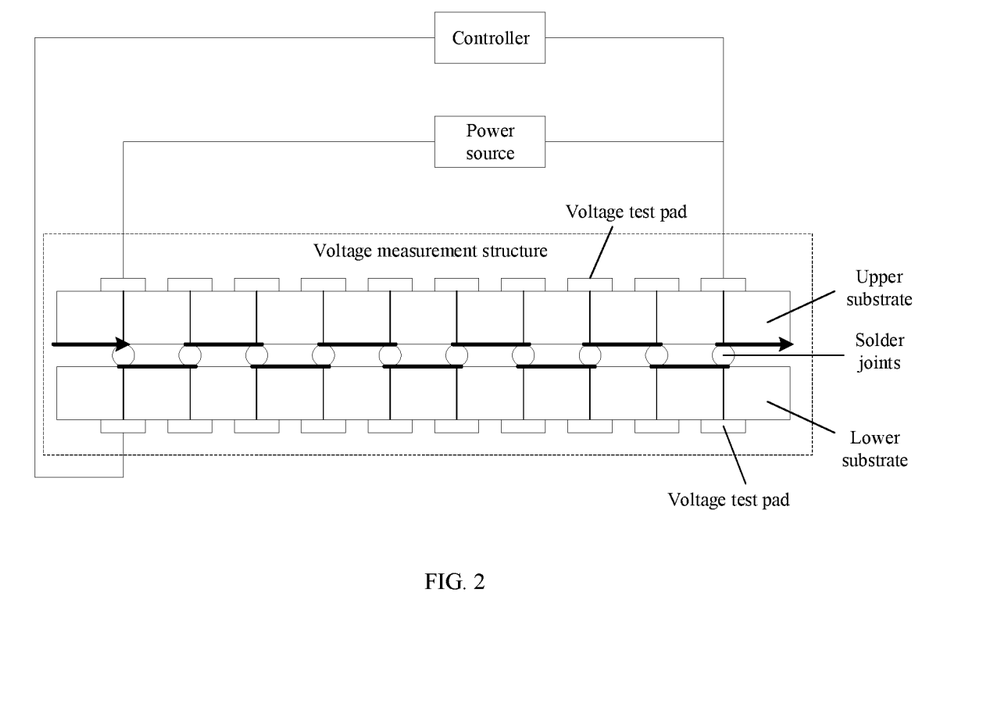
FIG. 2 is a schematic diagram of a structure for measuring electromigration of solder joints according to an embodiment of the present application.

An embodiment of the present application provides an apparatus for measuring electromigration of solder joints. FIG. 2 is a schematic diagram of an apparatus for measuring electromigration of solder joints according to an embodiment of the present application. As shown in FIG. 2, the apparatus includes: a power source, a controller, and a voltage measurement structure. The power source is respectively connected to the controller and the voltage measurement structure in parallel. The voltage measurement structure includes an upper substrate and a lower substrate. Metal connecting wires on the upper substrate and the lower substrate are connected in series through a plurality of solder joints to form a daisy chain. Voltage test pads are led out from both ends of the plurality of solder joints and arranged outside the upper substrate and the lower substrate, respectively, where the voltage measurement structure is configured to measure a voltage of a daisy subchain between one or more solder joints through the voltage test pads under the control of the controller; and the controller is configured to determine, according to the voltage, a resistance of the one or more solder joints.

In an embodiment, the controller is further configured to: select a first daisy subchain and a second daisy subchain which meet a minimum test precision, where solder joints at two ends of each of the first daisy subchain and the second daisy subchain are a first solder joint and a second solder joint, the first daisy subchain is provided with one more target solder joint than the second daisy subchain, the target solder joint is the first solder joint, and the number of solder joints included in the first daisy subchain is greater than or equal to the number of solder joints on a predetermined shortest daisy subchain; measure, according to voltage test pads corresponding to the first solder joint, a first voltage and a second voltage of the first solder joint, and measure, according to voltage test pads corresponding to the second solder joint, a first voltage and a second voltage of the second solder joint; and determine, according to the first voltage and the second voltage of the first solder joint and the first voltage and the second voltage of the second solder joint, a resistance of the target solder joint.

In an embodiment, the controller is further configured to: obtain a current input to the daisy chain; determine, according to the second voltage of the second solder joint and the first voltage of the first solder joint, a resistance of the first daisy subchain; determine, according to the second voltage of the second solder joint and the second voltage of the first solder joint, a resistance of the second daisy subchain; and determine a difference between the resistance of the first daisy subchain and the resistance of the second daisy subchain as a resistance of the target solder joint.

In an embodiment, the controller is further configured to: determine a first difference between the second voltage of the second solder joint and the first voltage of the first solder joint, and determine a ratio of the first difference to the current as a resistance of the first daisy subchain; and determine a second difference between the second voltage of the second solder joint and the second voltage of the first solder joint, and determine a ratio of the second difference to the current as a resistance of the second daisy subchain.

In an embodiment, the controller is further configured to obtain a resistance measurement lower limit and obtain an initial resistance value of a solder joint, where the initial resistance value is an actual measured resistance value or a theoretical resistance value of the solder joint; and determine, according to the resistance measurement lower limit and the initial resistance value, the number of solder joints on the shortest daisy subchain meeting the resistance measurement lower limit.

In an embodiment, the controller is further configured to determine, according to the number of solder joints on the shortest daisy subchain, a minimum number of solder joints on the daisy chain.

In an embodiment, the voltage test pads are led out from both ends of each of the plurality of solder joints through vias.

In an embodiment, the metal connecting wires among the plurality of solder joints have a same size and a same length.

Figure 3:
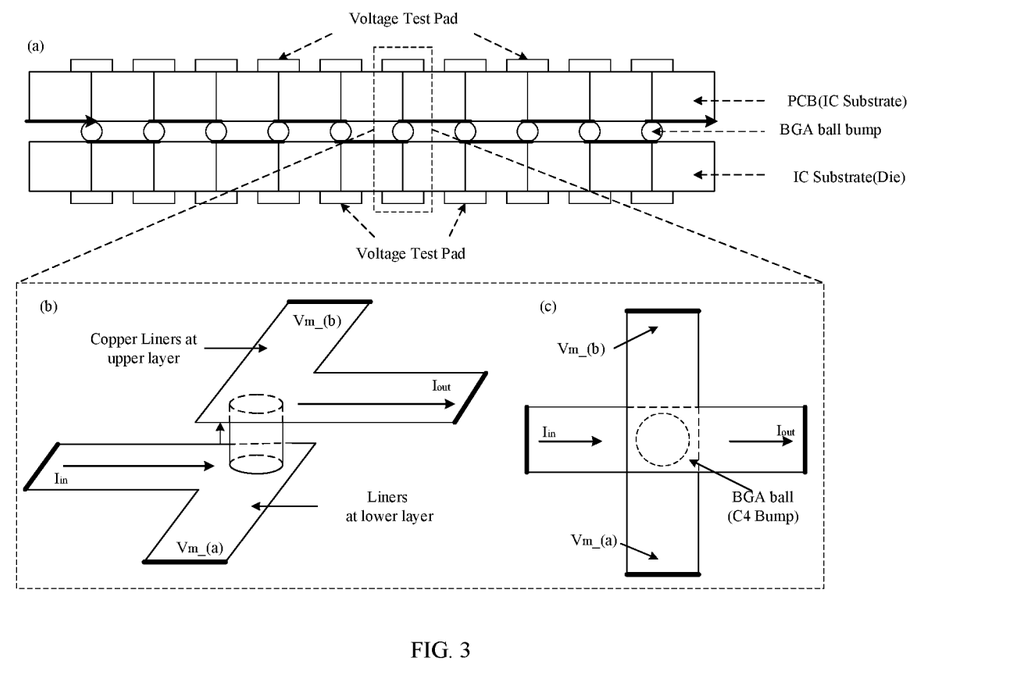
FIG. 3 is a schematic diagram of a daisy chain for monitoring an accelerated lifetime test of solder joint electromigration according to an embodiment of the present application.

By means of this embodiment, current mode distinguishing, an embedded Kelvin test structure, and parasitic resistance immunity can be implemented. FIG. 3 is a schematic diagram of a daisy chain for monitoring an accelerated lifetime test of solder joint electromigration according to an embodiment of the present application. A cross section of a daisy parent chain is shown in portion (a) of FIG. 3, a three-dimensional structure of an $m^{th}$ solder joint in portion (a) of FIG. 3 is shown in portion (b) of FIG. 3, and a top view structure of portion (b) of FIG. 3 is shown in portion (c) of FIG. 3. In these portions, current flows from a port $I_{in}$ to a port $I_{out}$, Vm_(a) and Vm_(b) respectively represent voltage test pads at left and right ends of the solder joint, in which a solder joint includes C4 bump for connecting a die and an IC substrate, and a BGA ball for connecting the IC substrate and a PCB. The resistance of a single solder joint is defined as $R_{solder}$.

Interconnection wires, including upper metal wires of the PCB, the IC substrate and the die, include solder joint-solder joint interconnection as well as solder joint-pad interconnection. A resistance of solder joint-solder joint interconnection is defined as $R_{line}$.

Embedded Kevin test structure: also known as a four-terminal test structure, which has a basic structure as shown in FIG. 3. Compared with the traditional daisy chain, voltage test pads are led out from both ends of each solder joint in this embodiment, and any two voltage test pads on the parent chain and the ends of the parent chain jointly form an embedded Kevin structure, so that the four-terminal measurement can be implemented on any subchain on the parent chain that meets the measurable minimum resistance ($R_{min}$) of the measurement system.

Figure 4:
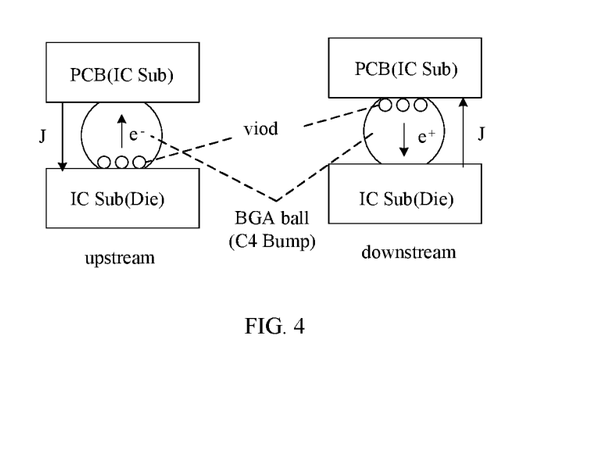
FIG. 4 is a schematic diagram of a current mode at a solder joint according to an embodiment of the present application.

FIG. 4 is a schematic diagram of a current mode at a solder joint according to an embodiment of the present application. As shown in FIG. 4, two different current modes at the solder joint are distinguished according to a current (or electron flow) direction. A current direction from an upper layer board (the PCB or IC Sub) to a lower layer board (the IC Sub or Die) indicates an upstream mode, and an opposite direction indicates a downstream mode. It should be noted that the electron flow direction is opposite to the current direction.

Figure 5:
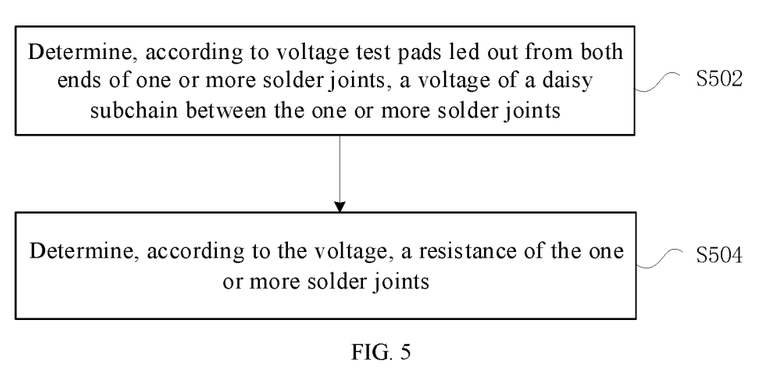
FIG. 5 is a flowchart of a data transmission method according to an embodiment of the present application.

According to another embodiment of the present application, there is further provided a method for measuring electromigration of solder joints, which is applicable to the controller of the apparatus described in any one of the above embodiments. FIG. 5 is a flowchart of a data transmission method according to an embodiment of the present application. As shown in FIG. 5, the flow includes the following operations S502 to S504.

At operation S502, determining, according to voltage test pads led out from both ends of one or more solder joints, a voltage of a daisy subchain between the one or more solder joints.

At operation S504, determining, according to the voltage, a resistance of the one or more solder joints.

Through the above operations S502 to S504, according to voltage test pads led out from both ends of one or more solder joints, a voltage of a daisy subchain between the one or more solder joints is determined; and according to the voltage, the resistance of the one or more solder joints is determined, so that the problem that solder joint resistance measurement by means of two-terminal measurement cannot measure the resistance of a single solder joint in the existing art can be solved, the resistance of a single solder joint can be measured, and effective reliability evaluation of solder joint electromigration failure can be implemented.

In an embodiment, operation S502 may include the following operations S5021 to S5023.

At S5021, selecting a first daisy subchain and a second daisy subchain which meet a minimum test precision, where solder joints at two ends of each of the first daisy subchain and the second daisy subchain are a first solder joint and a second solder joint, the first daisy subchain is provided with one more target solder joint than the second daisy subchain, the target solder joint is the first solder joint, and the number of solder joints included in the first daisy subchain is greater than or equal to the number of solder joints on a predetermined shortest daisy subchain.

At S5022, measuring, according to voltage test pads corresponding to the first solder joint, a first voltage and a second voltage of the first solder joint, and measuring, according to voltage test pads corresponding to the second solder joint, a first voltage and a second voltage of the second solder joint.

At S5023, determining, according to the first voltage and the second voltage of the first solder joint and the first voltage and the second voltage of the second solder joint, a resistance of the target solder joint.

In an optional embodiment, operation S5023 may include: obtaining a current input to the daisy chain; determining, according to the second voltage of the second solder joint and the first voltage of the first solder joint, a resistance of the first daisy subchain, which includes, determining a first difference between the second voltage of the second solder joint and the first voltage of the first solder joint, and determining a ratio of the first difference to the current as a resistance of the first daisy subchain; determining, according to the second voltage of the second solder joint and the second voltage of the first solder joint, a resistance of the second daisy subchain, which includes, determining a second difference between the second voltage of the second solder joint and the second voltage of the first solder joint, and determining a ratio of the second difference to the current as a resistance of the second daisy subchain; and determining a difference between the resistance of the first daisy subchain and the resistance of the second daisy subchain as a resistance of the target solder joint.

In an optional embodiment, before selecting the first daisy subchain and the second daisy subchain which meet the minimum test precision, the method further includes: obtaining a resistance measurement lower limit and obtaining an initial resistance value of a solder joint, where the initial resistance value is an actual measured resistance value or a theoretical resistance value of the solder joint; and determining, according to the resistance measurement lower limit and the initial resistance value, the number of solder joints on the shortest daisy subchain meeting the resistance measurement lower limit.

In another optional embodiment, after determining, according to the resistance measurement lower limit and the initial resistance value, the number of solder joints on the shortest daisy subchain meeting the resistance measurement lower limit, the method further includes: determining, according to the number of solder joints on the shortest daisy subchain, a minimum number of solder joints on the daisy chain.

In this embodiment, a uniform layout design of all solder balls and all inter-ball metal interconnection wires on the daisy chain is desired. If a lower limit of the measurement system for resistance measurement is $R_{min}$, a minimum number N of desired solder balls in series may be expressed as:

$$N_0 = \text{int}[R_{min}/(R_{line}+R_{solder})];$$

$$N = 2 \times (N_0+1);$$

where $N_0$ is the number of balls on the minimum chain (not considering single ball testing) that meets the test requirement $R_{min}$, and is a function of rounding up the value in the square brackets.

If $N_0 \neq 1$, then the resistance of a single solder joint is desired to be indirectly extracted by selecting two specific subchains on the daisy chain. The resistance of an $m^{th}$ solder ball on the daisy chain may be obtained by measuring a difference between a $[m\_(a), m+N_0+2\_(a)]$ subchain and a $[m\_(b), m+N_0+2\_(a)]$ subchain or between a $[m-N_0-2\_(b), m\_(b)]$ subchain and a $[[m-N_0-2\ (b), m\_(a)]]$ subchain, which are respectively shown as:

$$R_{(m)} = R_{[m\_(a), m+N_0+2\_(a)]} - R_{[m\_(b), m+N_0+2\_(a)]};$$

$$R_{(m)} = R_{[m-N_0-2\_(b), m\_(b)]} - R_{([m-N_0-2\_(b), m\_(a)])};$$

where $N_0$ is the number of solder joint on a minimum subchain, subscripts m_(a) and m_(b) represent voltage test pads on left and right sides of the $m^{th}$ solder joint, respectively, and so on and so forth. $R_{[m\_(b), m+N_0+2\_(a)]}$ and $R_{([m-N_0-2\_(b), m\_(a)])}$ are minimum subchains meeting $R_{min}$.

If $N_0 = 1$, then the resistance can be directly obtained through a voltage difference $[Vm\_(b) - Vm\_(a)]$ between two ends of the solder joint and the current I in portion (c) of FIG. 3, and satisfies:

$$R_{(m)} = [V_{m\_(b)} - V_{m\_(a)}]/I.$$

Daisy parent chain in this embodiment includes upper and lower substrates (including a PCB, an IC substrate, a die), solder joints (including a C4 bump and a BGA ball), and interconnection wires between the solder joints. The number of solder joints on the daisy chain is any natural number not less than N.

Embedded Kevin test structure: voltage test pads are led out from both ends of a solder joint, and any two voltage test pads form a Kevin test structure with a current input port.

Daisy subchain: a chain meeting a minimum resistance precision ($R_{min}$) of the measuring system, where the number of solder joints included in the daisy subchain is an integer not less than $N_0$.

In this embodiment, determining the resistance of the solder joint may include: determining geometric dimensions of a solder joint ($R_{solder}$) and an interconnection wire ($R_{line}$), and further obtaining an actual measured value or a theoretical calculated value of the resistance; calculating, according to the above resistance values of different components, a length ($N_0$) of a shortest daisy subchain and a total number (N) of solder joints in series on the daisy chain; designing the daisy parent chain according to the calculated total number of solder joints so that the solder joints are sequentially connected in series; and leading out voltage test pads from both ends of N solder joints to record voltage values of different pads on the daisy chain circuit.

Figure 6:
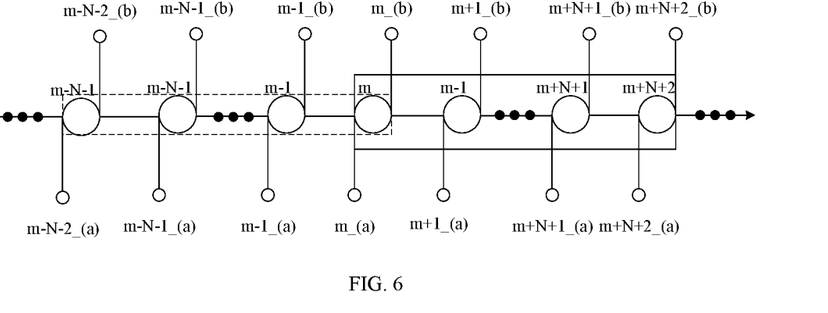
FIG. 6 is a schematic diagram of selecting the shortest subchain according to an embodiment of the present application.

FIG. 6 is a schematic diagram of selecting the shortest subchain according to an embodiment of the present application. As shown in FIG. 6, two specific shortest subchains meeting the minimum test precision ($R_{min}$) are selected.

Voltage values of voltage pads at both ends of the subchain are measured.

If $N_0 \neq 1$, the equation 2a or 2b is used to extract the resistance of a single solder joint which is distinguishable by the current mode and immune to a parasitic resistance; and if $N_0=1$, the resistance of the solder joint can be obtained from the above equation.

Geometric dimensions of a solder joint and an interconnection wire are determined, and an actual measured value or a theoretical value corresponding to the resistance is obtained. A length ($N_0$) of a shortest daisy subchain and a total number (N) of solder joints in series on the daisy chain are calculated.

All solder joints are connected in series to implement a daisy parent chain and a current path, and voltage test pads are led out from both ends of each solder joint.

Two specific shortest subchains meeting the minimum test precision ($R_{min}$) are selected. Voltage values of voltage pads at both ends of the subchain are measured to extract the resistance of the solder joint.

In this embodiment, the resistance of a single solder joint can be measured, and parasitic resistances of the daisy chain and an external test system can be eliminated, and solder joints of different current modes can be distinguished, thereby saving the test cost, and improving the test precision of the solder joint resistance.

Figure 7:
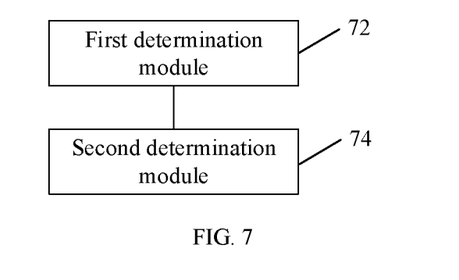
FIG. 7 is a block diagram of an apparatus for measuring electromigration of solder joints according to an embodiment of the present application.

According to still another embodiment of the present application, there is further provided an apparatus for measuring electromigration of solder joints. FIG. 7 is a block diagram of an apparatus for measuring electromigration of solder joints according to an embodiment of the present application. As shown in FIG. 7, the apparatus includes: a first determination module 72 configured to determine, according to voltage test pads led out from both ends of one or more solder joints, a voltage of a daisy subchain between the one or more solder joints; and a second determination module 74 configured to determine, according to the voltage, a resistance of the one or more solder joints.

In an embodiment, the first determination module 82 includes: a selection submodule configured to select a first daisy subchain and a second daisy subchain which meet a minimum test precision, where solder joints at two ends of each of the first daisy subchain and the second daisy subchain are a first solder joint and a second solder joint, the first daisy subchain is provided with one more target solder joint than the second daisy subchain, the target solder joint is the first solder joint, and the number of solder joints included in the first daisy subchain is greater than or equal to the number of solder joints on a predetermined shortest daisy subchain; a measurement submodule configured to measure, according to voltage test pads corresponding to the first solder joint, a first voltage and a second voltage of the first solder joint, and measure, according to voltage test pads corresponding to the second solder joint, a first voltage and a second voltage of the second solder joint; and a first determination submodule configured to determine, according to the first voltage and the second voltage of the first solder joint and the first voltage and the second voltage of the second solder joint, a resistance of the target solder joint.

In an embodiment, the second determination module 74 includes: an obtaining submodule configured to obtain a current input to the daisy chain; a second determination submodule configured to determine, according to the second voltage of the second solder joint and the first voltage of the first solder joint, a resistance of the first daisy subchain; a third determination submodule configured to determine, according to the second voltage of the second solder joint and the second voltage of the first solder joint, a resistance of the second daisy subchain; and a fourth determination submodule configured to determine a difference between the resistance of the first daisy subchain and the resistance of the second daisy subchain as a resistance of the target solder joint.

In an embodiment, the second determination submodule is further configured to determine a first difference between the second voltage of the second solder joint and the first voltage of the first solder joint, and determine a ratio of the first difference to the current as a resistance of the first daisy subchain.

The third determination submodule is further configured to determine a second difference between the second voltage of the second solder joint and the second voltage of the first solder joint, and determine a ratio of the second difference to the current as a resistance of the second daisy subchain.

In an embodiment, before selecting the first daisy subchain and the second daisy subchain which meet the minimum test precision, the apparatus further includes: an obtaining module configured to obtain a resistance measurement lower limit and obtain an initial resistance value of a solder joint, where the initial resistance value is an actual measured resistance value or a theoretical resistance value of the solder joint; and a third determination module configured to determine, according to the resistance measurement lower limit and the initial resistance value, the number of solder joints on the shortest daisy subchain meeting the resistance measurement lower limit.

In an embodiment, the apparatus further includes: a fourth determination module configured to determine, according to the number of solder joints on the shortest daisy subchain, a minimum number of solder joints on the daisy chain.

An embodiment of the present application further provides a computer-readable storage medium having a computer program stored thereon, where the computer program is configured to, when executed, cause operations of any one of the above method embodiments to be implemented.

In an exemplary embodiment, the computer-readable storage medium may include, but is not limited to: a U disk, a read-only memory (ROM), a random access memory (RAM), a mobile hard disk, a disk or optical disk, or any other medium that can store a computer program.

An embodiment of the present application further provides an electronic apparatus, including a memory and a processor, where the memory has a computer program stored thereon, and the processor is configured to execute the computer program to implement operations of any one of the method embodiments as described above.

In an exemplary embodiment, the electronic apparatus may further include a transmission device and an input/output device. The transmission device is connected to the processor, and the input/output device is connected to the processor.

Specific examples in the present embodiment may refer to the examples described in the foregoing embodiments and exemplary implementations, which will not be repeated in the present embodiment.

Apparently, a person skilled in the art will understand that the above modules and operations of the present application may be implemented by a universal computing device, may be integrated in a single computing device or distributed over a network that consists of a plurality of computing devices. They can be realized using the executable program code of the computing device so that they can be stored in a storage device and executed by the computing device, in some cases, can perform the shown or described operations in a sequence other than herein, or they are made into different integrated circuit modules respectively, or a plurality of modules or operations thereof are made into a single integrated circuit module, thus to be realized. In this way, the present application is not limited to any specific hardware and software combination.

The descriptions above are merely preferred embodiments of the present application, which are not used to limit the present application. For those skilled in the art, the present application may have various changes and variations. Any amendments, equivalent substitutions, improvements, etc. within the principle of the present application are all included in the protection scope defined by the appended claims of the present application.

What is claimed is:

1. An apparatus for measuring electromigration of solder joints, comprising: a power source, a controller, and a voltage measurement structure, wherein the power source is respectively connected to the controller and the voltage measurement structure in parallel, the voltage measurement structure comprises an upper substrate and a lower substrate, metal connecting wires on the upper substrate and the lower substrate are connected in series through a plurality of solder joints to form a daisy chain, and voltage test pads are led out from both ends of each of the plurality of solder joints and arranged outside the upper substrate and the lower substrate, respectively, the voltage measurement structure is configured to measure a voltage of a daisy subchain between one or more solder joints through the voltage test pads under control of the controller; and the controller is configured to determine, according to the voltage, a resistance of the one or more solder joints, wherein the controller is further configured to:

select a first daisy subchain and a second daisy subchain which meet a minimum test precision, wherein solder joints at two ends of each of the first daisy subchain and the second daisy subchain are a first solder joint and a second solder joint, the first daisy subchain is provided with one more target solder joint than the second daisy subchain, the target solder joint is the first solder joint, and a number of solder joints comprised in the first daisy subchain is greater than or equal to a number of solder joints on a predetermined shortest daisy subchain;

measure, according to voltage test pads corresponding to the first solder joint, a first voltage and a second voltage of the first solder joint, and measure, according to voltage test pads corresponding to the second solder joint, a first voltage and a second voltage of the second solder joint; and determine, according to the first voltage and the second voltage of the first solder joint and the first voltage and the second voltage of the second solder joint, a resistance of the target solder joint.

2. The apparatus according to claim 1, wherein the controller is further configured to obtain a current input to the daisy chain;

determine, according to the second voltage of the second solder joint and the first voltage of the first solder joint, a resistance of the first daisy subchain;

determine, according to the second voltage of the second solder joint and the second voltage of the first solder joint, a resistance of the second daisy subchain; and determine a difference between the resistance of the first daisy subchain and the resistance of the second daisy subchain as a resistance of the target solder joint.

3. The apparatus according to claim 2, wherein the controller is further configured to determine a first difference between the second voltage of the second solder joint and the first voltage of the first solder joint, and determine a ratio of the first difference to the current as a resistance of the first daisy subchain; and determine a second difference between the second voltage of the second solder joint and the second voltage of the first solder joint, and determine a ratio of the second difference to the current as a resistance of the second daisy subchain.

4. The apparatus according to claim 1, wherein the controller is further configured to obtain a resistance measurement lower limit and obtain an initial resistance value of a solder joint, wherein the initial resistance value is an actual measured resistance value or a theoretical resistance value of the solder joint; and determine, according to the resistance measurement lower limit and the initial resistance value, the number of solder joints on the shortest daisy subchain meeting the resistance measurement lower limit.

5. The apparatus according to claim 4, wherein the controller is further configured to determine, according to the number of solder joints on the shortest daisy subchain, a minimum number of solder joints on the daisy chain.

6. The apparatus according to claim 1, wherein the voltage test pads are led out from both ends of each of the plurality of solder joints through vias.

7. The apparatus according to claim 1, wherein the metal connecting wires among the plurality of solder joints have a same size and a same length.

8. A method for measuring electromigration of solder joints, comprising:

determining, according to voltage test pads led out from both ends of one or more solder joints, a voltage of a daisy subchain between the one or more solder joints; and determining, according to the voltage, a resistance of the one or more solder joints, wherein determining, according to voltage test pads led out from both ends of one or more solder joints, the voltage of the daisy subchain between the one or more solder joints comprises:

selecting a first daisy subchain and a second daisy subchain which meet a minimum test precision, wherein solder joints at two ends of each of the first daisy subchain and the second daisy subchain are a first solder joint and a second solder joint, the first daisy subchain is provided with one more target solder joint than the second daisy subchain, the target solder joint is the first solder joint, and a number of solder joints comprised in the first daisy subchain is greater than or equal to a number of solder joints on a predetermined shortest daisy subchain;

measuring, according to voltage test pads corresponding to the first solder joint, a first voltage and a second voltage of the first solder joint, and measuring, according to voltage test pads corresponding to the second solder joint, a first voltage and a second voltage of the second solder joint; and determining, according to the first voltage and the second voltage of the first solder joint and the first voltage and the second voltage of the second solder joint, a resistance of the target solder joint.

9. The method according to claim 8, wherein determining, according to the first voltage and the second voltage of the first solder joint and the first voltage and the second voltage of the second solder joint, the resistance of the target solder joint comprising:

obtaining a current input to a daisy chain;

determining, according to the second voltage of the second solder joint and the first voltage of the first solder joint, a resistance of the first daisy subchain;

determining, according to the second voltage of the second solder joint and the second voltage of the first solder joint, a resistance of the second daisy subchain; and determining a difference between the resistance of the first daisy subchain and the resistance of the second daisy subchain as a resistance of the target solder joint.

10. The method according to claim 9, wherein determining, according to the second voltage of the second solder joint and the first voltage of the first solder joint, the resistance of the first daisy subchain comprises:

determining a first difference between the second voltage of the second solder joint and the first voltage of the first solder joint, and determining a ratio of the first difference to the current as a resistance of the first daisy subchain; and determining, according to the second voltage of the second solder joint and the second voltage of the first solder joint, the resistance of the second daisy subchain comprises:

determining a second difference between the second voltage of the second solder joint and the second voltage of the first solder joint, and determining a ratio of the second difference to the current as a resistance of the second daisy subchain.

11. The method according to claim 8, wherein before selecting the first daisy subchain and the second daisy subchain which meet the minimum test precision, the method further comprises:

obtaining a resistance measurement lower limit and obtaining an initial resistance value of a solder joint, wherein the initial resistance value is an actual measured resistance value or a theoretical resistance value of the solder joint; and determining, according to the resistance measurement lower limit and the initial resistance value, the number of solder joints on the shortest daisy subchain meeting the resistance measurement lower limit.

12. The method according to claim 11, wherein after determining, according to the resistance measurement lower limit and the initial resistance value, the number of solder joints on the shortest daisy subchain meeting the resistance measurement lower limit, the method further comprises:

determining, according to the number of solder joints on the shortest daisy subchain, a minimum number of solder joints on a daisy chain.

13. An apparatus for measuring electromigration of solder joints, comprising:

a first determination module configured to determine, according to voltage test pads led out from both ends of one or more solder joints, a voltage of a daisy subchain between the one or more solder joints; and a second determination module configured to determine, according to the voltage, a resistance of the one or more solder joints, wherein the first determination module is further configured to:

select a first daisy subchain and a second daisy subchain which meet a minimum test precision, wherein solder joints at two ends of each of the first daisy subchain and the second daisy subchain are a first solder joint and a second solder joint, the first daisy subchain is provided with one more target solder joint than the second daisy subchain, the target solder joint is the first solder joint, and a number of solder joints comprised in the first daisy subchain is greater than or equal to a number of solder joints on a predetermined shortest daisy subchain;

measure, according to voltage test pads corresponding to the first solder joint, a first voltage and a second voltage of the first solder joint, and measure, according to voltage test pads corresponding to the second solder joint, a first voltage and a second voltage of the second solder joint; and determine, according to the first voltage and the second voltage of the first solder joint and the first voltage and the second voltage of the second solder joint, a resistance of the target solder joint.

14. A non-transitory computer-readable storage medium having a computer program stored thereon, wherein the computer program is configured to be executed to cause the method according to claim 8 to be implemented.

15. An electronic apparatus, comprising a memory and a processor, wherein the memory has a computer program stored thereon, and the processor is configured to execute the computer program to implement the method according to claim 8.

* * * * *